United States Patent
Lee et al.

(10) Patent No.: US 9,202,870 B2
(45) Date of Patent: Dec. 1, 2015

(54) SEMICONDUCTOR DEVICE AND METHOD OF MANUFACTURING THE SAME

(71) Applicant: SK hynix Inc., Gyeonggi-do (KR)

(72) Inventors: Ki Hong Lee, Gyeonggi-do (KR); Seung Ho Pyi, Gyeonggi-do (KR); Jin Ho Bin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/741,097

(22) Filed: Jun. 16, 2015

(65) Prior Publication Data

US 2015/0279938 A1    Oct. 1, 2015

Related U.S. Application Data

(62) Division of application No. 13/828,109, filed on Mar. 14, 2013, now Pat. No. 9,087,735.

(30) Foreign Application Priority Data

Nov. 16, 2012 (KR) ................ 10-2012-0130160

(51) Int. Cl.
*H01L 21/336* (2006.01)
*H01L 29/10* (2006.01)
*H01L 29/423* (2006.01)
*H01L 29/66* (2006.01)

(52) U.S. Cl.
CPC ...... *H01L 29/1054* (2013.01); *H01L 29/42328* (2013.01); *H01L 29/42344* (2013.01); *H01L 29/42352* (2013.01); *H01L 29/66666* (2013.01); *H01L 29/66825* (2013.01); *H01L 29/66833* (2013.01)

(58) Field of Classification Search
USPC .......................................... 438/269; 257/51
See application file for complete search history.

(56) References Cited

U.S. PATENT DOCUMENTS

| | | | | |
|---|---|---|---|---|
| 7,799,592 B2* | 9/2010 | Lochtefeld | ........ | H01L 29/66795 257/185 |
| 7,977,706 B2* | 7/2011 | Lochtefeld | ........ | H01L 29/66795 257/190 |
| 8,309,986 B2* | 11/2012 | Lochtefeld | ........ | H01L 29/66795 257/190 |
| 8,335,111 B2* | 12/2012 | Fukuzumi | .......... | G11C 16/0483 257/324 |
| 8,530,959 B2* | 9/2013 | Chang | ............... | H01L 27/11551 257/315 |
| 8,628,989 B2* | 1/2014 | Lochtefeld | ........ | H01L 29/66795 257/185 |
| 8,981,450 B2* | 3/2015 | Shin | ....................... | H01L 29/792 257/315 |
| 2008/0073667 A1* | 3/2008 | Lochtefeld | ........ | H01L 29/66795 257/190 |
| 2010/0301391 A1* | 12/2010 | Lochtefeld | ........ | H01L 29/66795 257/190 |
| 2011/0210374 A1* | 9/2011 | Lochtefeld | ........ | H01L 29/66795 257/190 |
| 2011/0303958 A1* | 12/2011 | Matsuo | ............... | H01L 29/7926 257/314 |
| 2012/0008400 A1* | 1/2012 | Fukuzumi | .......... | G11C 16/0483 365/185.18 |
| 2012/0043673 A1* | 2/2012 | Chang | ............... | H01L 27/11551 257/786 |
| 2012/0049268 A1* | 3/2012 | Chang | ............... | H01L 21/28273 257/324 |

(Continued)

*Primary Examiner* — Telly Green
(74) *Attorney, Agent, or Firm* — IP & T Group LLP

(57) ABSTRACT

A semiconductor device includes first conductive layers and first interlayer insulating layers stacked alternately with each other, at least one second conductive layer and at least one second interlayer insulating layer formed on the first conductive layers and the first interlayer insulating layers and stacked alternately with each other, a first semiconductor layer passing through the first conductive layers and the first interlayer insulating layers and including polysilicon, and a second semiconductor layer coupled to the first semiconductor layer and passing through the at least one second conductive layer the at least one second interlayer insulating layer, wherein the second semiconductor layer includes silicon germanium.

7 Claims, 6 Drawing Sheets

(56) References Cited

U.S. PATENT DOCUMENTS

2013/0034943 A1* 2/2013 Lochtefeld ........ H01L 29/66795 438/299

2013/0056820 A1* 3/2013 Jeong .................. H01L 27/0688 257/324

2013/0248977 A1* 9/2013 Mori ................... H01L 29/7926 257/326

* cited by examiner

SEMICONDUCTOR DEVICE AND METHOD OF MANUFACTURING THE SAME

CROSS-REFERENCE TO RELATED APPLICATION

This application is a division of U.S. patent application Ser. No. 13/828,109 filed on Mar. 14, 2013, which claims priority of Korean patent application number 10-2012-0130160, filed on Nov. 16, 2012. The entire disclosure of which each of the foregoing application is incorporated herein by reference in its entirety.

BACKGROUND

1. Field of Invention

Embodiments of the present invention relate to a semiconductor device and a method of manufacturing the same and, more particularly, to a three-dimensional semiconductor device and a method of manufacturing the same.

2. Description of Related Art

A non-volatile memory retains data stored therein even when not powered. Two-dimensional (2D) memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

However, in terms of structural characteristics, it may be difficult for a 3D non-volatile memory device to control a threshold voltage of a selection transistor. On the other hand, as for a 2D non-volatile memory device, a threshold voltage of a selection transistor may be controlled by implanting impurities. However, this method may not allow a 3D non-volatile memory device to control a threshold voltage of a selection transistor.

DESCRIPTION OF EMBODIMENTS

Figure 1A:
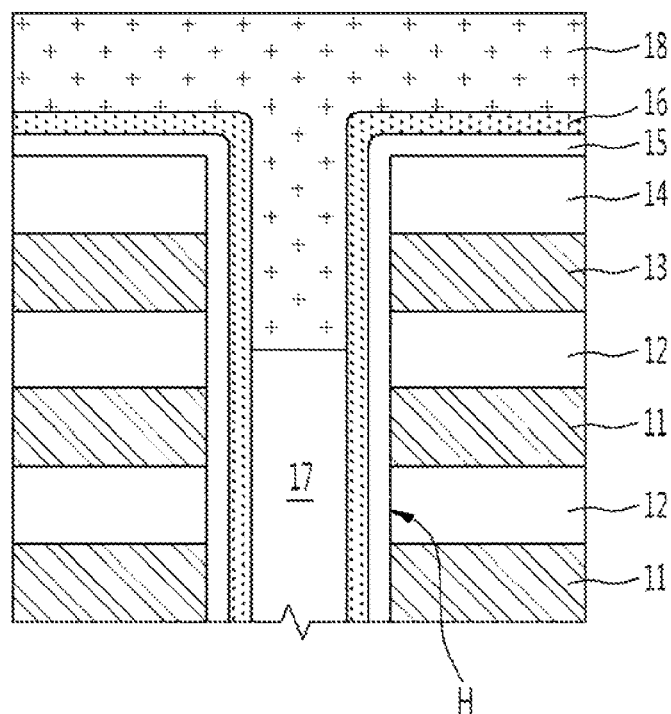
FIGS. 1A to 1D are cross-sectional views illustrating a process flow for a method of manufacturing a semiconductor device according to an exemplary embodiment.

Hereinafter, various exemplary embodiments will be described with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

FIGS. 1A to 1D are cross-sectional views illustrating a process flow for an exemplary method of manufacturing a semiconductor device. However, for illustration purposes, only some of the memory cells and the selection transistors are depicted, and other regions are omitted.

As illustrated in FIG. 1A, first material layers 11 and second material layers 12 may be formed alternately with each other. The first material layers 11 may be configured as control gates of memory cells, and the second material layers 12 may be configured as interlayer insulating layers.

Subsequently, at least one third material layer 13 and at least one fourth material layer 14 may be formed alternately with each other over the first and second material layers 11 and 12. Here, the third material layer 13 may be configured as a selection gate of a selection transistor, and the fourth material layer 14 may be configured as an interlayer insulating layer.

For example, the first material layers 11 are formed of materials having a high etch selectivity to the second material layers 12, and the third material layer 13 are formed of materials having a high etch selectivity to the fourth material layer 14 For example, the first or third material layer 11 or 13 may include a conductive layer, such as a polysilicon layer, and the second or fourth material layer 12 or 14 may include an insulating layer, such as an oxide layer. In another example, the first or third material layer 11 or 13 may include a conductive layer, such as a doped polysilicon layer or a doped amorphous silicon layer. The second or fourth material layer 12 or 14 may include a sacrificial layer, such as an undoped polysilicon layer or an undoped amorphous silicon layer. In yet another example, the first or third material layer 11 or 13 may include a sacrificial layer, such as a nitride layer, and the second or fourth material layer 12 or 14 may include an insulating layer, such as an oxide layer.

In an exemplary embodiment the first and third material layers 11 and 13 may include sacrificial layers, and the second and fourth material layers 12 and 14 may include insulating layers.

A hole H may be formed through the first to fourth material layers 11 to 14. For example, the first to fourth material layers 11 to 14 may be etched to form the hole H. The hole H may have various cross-sections such as circular, elliptical, rectangular, polygonal, or linear. The hole H may be a channel hole, formed in memory cells and selection transistors, or an electrode hole for forming vertical electrodes.

A first memory layer 15 may be formed along an inner surface of the hole H. The first memory layer 15 may be formed to store data. The first memory layer 15 may include at least one of a charge blocking layer, a charge storing layer, and a tunnel insulating layer. Here, the charge storing layer may include a floating gate layer (e.g., a polysilicon layer that can store a charge), a trap layer (e.g., a nitride layer that can trap a charge), or nanodots. For reference, the first memory layer 15 may include a phase-change material layer instead of the charge storing layer.

A first semiconductor layer 16 may be formed on the first memory layer 15. For example, the first semiconductor layer 16 may include undoped polysilicon. Here, the first semiconductor layer 16 may be formed so that the hole H may have an open central portion.

The hole H, where the first semiconductor layer 16 is formed, may be filled with an insulating layer 17. The insulating layer 17 may be etched by a predetermined thickness to form a first recessed region through which a top portion of the hole H may be open. For example, the insulating layer 17 may be etched so that a top surface of the insulating layer 17 may be lower than or adjacent to a bottom surface of the lowermost third material layer 13 and the top surface of the insulating layer 17 may be higher than a top surface of the uppermost first material layer 11.

The first recessed region may be filled with a second semiconductor layer 18. For example, the second semiconductor layer 18 may include silicon germanium.

Figure 1B:
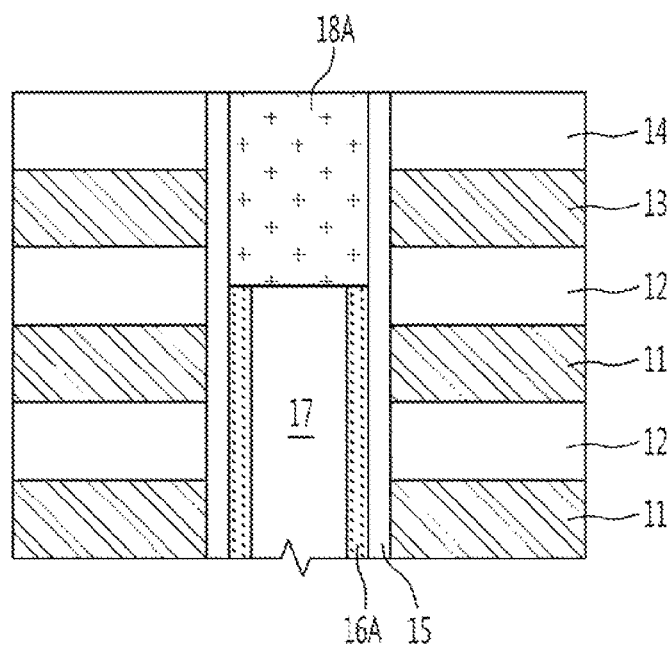

As illustrated in FIG. 1B, a third semiconductor layer 18A may be formed by reacting the second semiconductor layer and the first semiconductor layer 16 using a thermal treatment process. For example, the thermal treatment process may be performed by using a laser annealing process or a thermal annealing process.

As described above, when the second semiconductor layer 18 includes silicon germanium, and the first semiconductor layer 16 includes undoped polysilicon, the third semiconductor layer 18A may be formed by reacting the first semiconductor layer 16 and the second semiconductor layer 18 so that the third semiconductor layer 18A may include a homogeneous silicon germanium layer.

A portion of the first semiconductor layer 16 that is formed in an upper part of the hole H and directly contacts the second semiconductor layer 18 may react with the second semiconductor layer 18 to form the third semiconductor layer 18A. On the other hand, since a central portion of the first semiconductor layer 16A that is formed in a lower part of the hole H may be filled with the insulating layer 17, the first semiconductor layer 16A formed in the lower part of the hole H may not directly contact the second semiconductor layer 18. Therefore, the first semiconductor layer 16A formed in the lower part of the hole H may not react with the second semiconductor layer 18 and may remain unchanged.

The third semiconductor layer 18A may be planarized until a surface of the fourth material layer 14 is exposed. For reference, the second semiconductor layer 18 may be planarized until the surface of the fourth material layer 14 is exposed, and a thermal treatment process may be performed to form the third semiconductor layer 18A.

As a result, the first semiconductor layer 16A may pass through the first and second material layers 11 and 12 and have a tubular structure. The third semiconductor layer 18A may be coupled to the first semiconductor layer 16A, pass through the third and fourth material layers 13 and 14 and have a pillar structure. The first semiconductor layer 16A may be a channel layer of memory cells, and the third semiconductor layer 18A may be a channel layer of selection transistors.

For reference, each of the first and third semiconductor layers 16A and 18A may have any one of a tubular structure and a pillar structure. For example, each of the first and third semiconductor layers 16A and 18A may a tubular structure, or the first semiconductor layer 16A may have a pillar structure and the third semiconductor layer 18A may have a tubular structure, or each of the first and third semiconductor layers 16A and 18A may have a pillar structure.

Figure 1C:
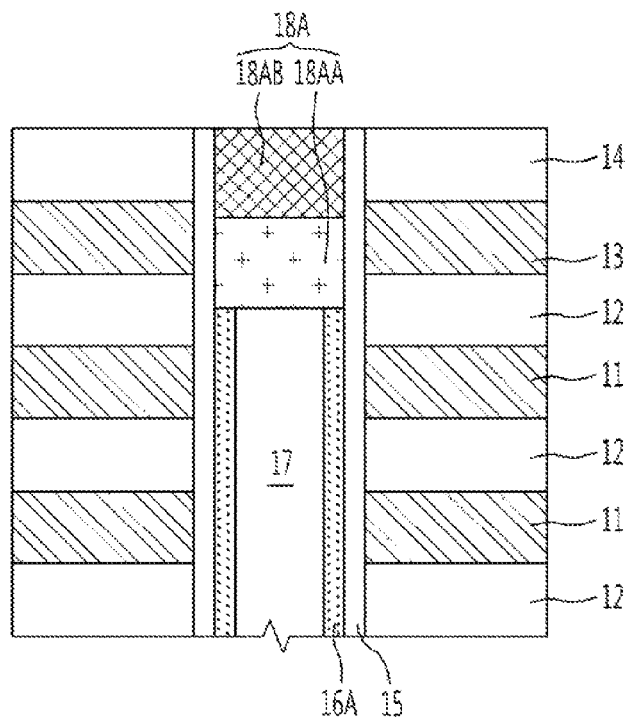

As illustrated in FIG. 1C, the third semiconductor layer 18A may be doped with an impurity to form a junction 18AB at the top of the third semiconductor layer 18A. For example, the junction 18AB may be formed by forming a mask pattern exposing the third semiconductor layer 18A on the fourth material layer 14 and doping the third semiconductor layer 18A with an N-type impurity or a P-type impurity by using the mask pattern as a barrier.

When the third semiconductor layer 18A is used as a channel layer of a selection transistor, a portion 18AA of the third semiconductor layer 18A, except for the junction 18AB, may function as a substantial channel layer.

In addition, the junction 18AB may be defined to partially overlap with the third material layer 13. For example, the position of the junction 18AB may be controlled by process conditions such as an impurity concentration and an Rp point during an impurity doping process.

Figure 1D:
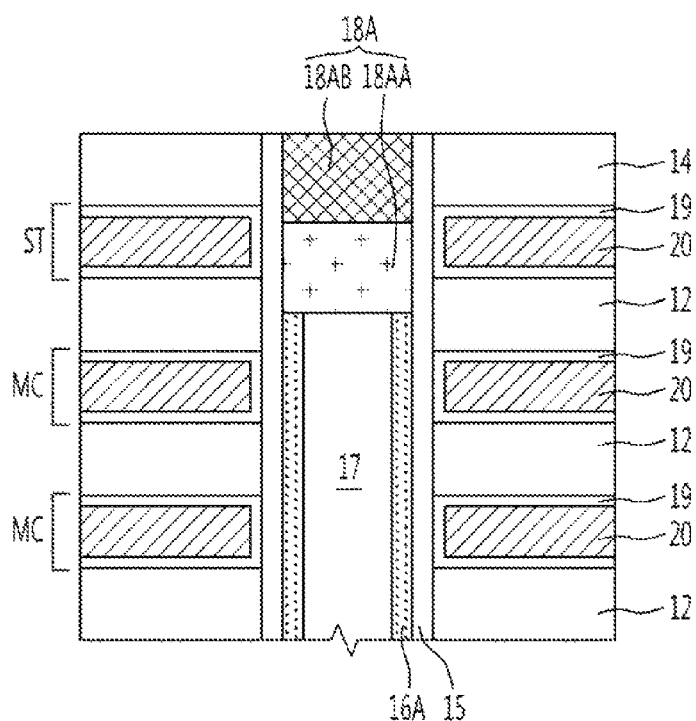

As illustrated in FIG. 1D, the first to fourth material layers 11 to 14 may be etched to form a slit (not illustrated), and the first and third material layers 11 and 13 exposed through the slit may be removed to form second recessed regions. Subsequently, conductive layers 20 may be formed in the second recessed regions. At this time, second memory layers 19 may be formed in the second recessed regions before the conductive layers 20 are formed. Each of the second memory layers 19 may include at least one of a tunnel insulating layer, a charge storing layer, and a charge blocking layer. For example, the second memory layer 19 may include a charge blocking layer in which an oxide layer and a high dielectric constant layer are stacked. In an alternative implementation, the second memory layers 19 may be formed without forming the first memory layer 15.

The conductive layers 20 replacing the first material layers 11 may be control gates of memory cells, and the conductive layer 20 replacing the third material layer 13 may be a selection gate of a selection transistor. In this example, a selection transistor may be stacked on the stacked memory cells. In addition, selection transistors may be stacked in at least one level.

For reference, a description has been made in reference to a case in which the conductive layers 20 are formed after the junction 18AB is formed. However, the junction 18AB may be formed after the conductive layers 20 are formed.

Depending on materials used to form the first to fourth material layers 11 to 14, partial changes may be made to the aforementioned manufacturing processes, especially the processes subsequent to forming a slit.

For example, each of the first and third material layers 11 and 13 may include a conductive layer, and each of the second and fourth material layers 12 and 14 may include an interlayer insulating layer. In this example, a slit may be formed, and the first and third material layers 11 and 13 exposed through the slit may be silicided. Subsequently, an insulating layer may be formed in the slit.

In another example, each of the first and third material layers 11 and 13 may include a conductive layer, and each of the second and fourth material layers 12 and 14 may include a sacrificial layer. In this example, the second and fourth material layers 12 and 14 exposed through the slit may be removed to form third recessed regions. Subsequently, the first and third material layers 11 and 13 exposed through the slit may be silicided, and insulating layers may be formed in the third recessed regions. At this time, the first memory layer 15 exposed through the third recessed regions may be etched before insulating layers are formed in the third recessed regions. Subsequently, an insulating layer may be formed in the slit.

FIGS. 2A to 2D are cross-sectional views illustrating a process flow for an exemplary method of manufacturing a semiconductor device. For illustration purposes, only some of the memory cells and the selection transistors are depicted, and other regions are omitted. Hereinafter, a description of features already described above may be omitted.

Figure 2A:
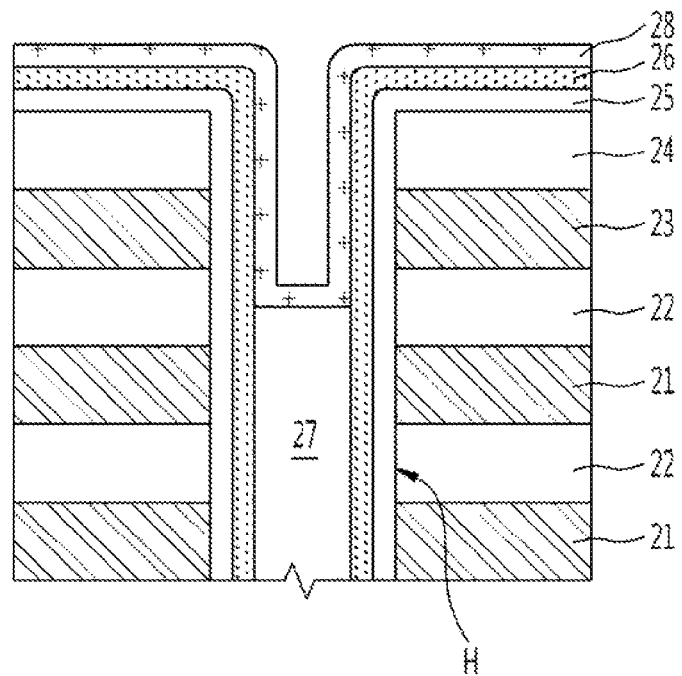
FIGS. 2A to 2D are cross-sectional views illustrating a method of manufacturing a semiconductor device according to an exemplary embodiment.

As illustrated in FIG. 2A, first material layers 21 and second material layers 22 may be formed alternately with each other. Subsequently, at least one third material layer 23 and at least one fourth material layer 24 may be formed alternately with each other over the first and second material layers 21 and 22. In an exemplary implementation, each of the first and third material layers 21 and 23 may include a sacrificial layer, and each of the second and fourth material layers 22 and 24 may include an insulating layer.

A hole H may pass through the first to fourth material layers 21 to 24, and a first memory layer 25 may be formed along an inner surface of the hole H. A first semiconductor layer 26 may be formed on the first memory layer 25.

The hole H, in which the first semiconductor layer 26 is formed, may be filled with a first insulating layer 27. The first insulating layer 27 may be etched by a predetermined thickness to form a first recessed region, through which a top portion of the hole H may be open. A second semiconductor layer 28 may be formed along an inner surface of the first recessed region. The second semiconductor layer 28 may have an open central portion.

Figure 2B:
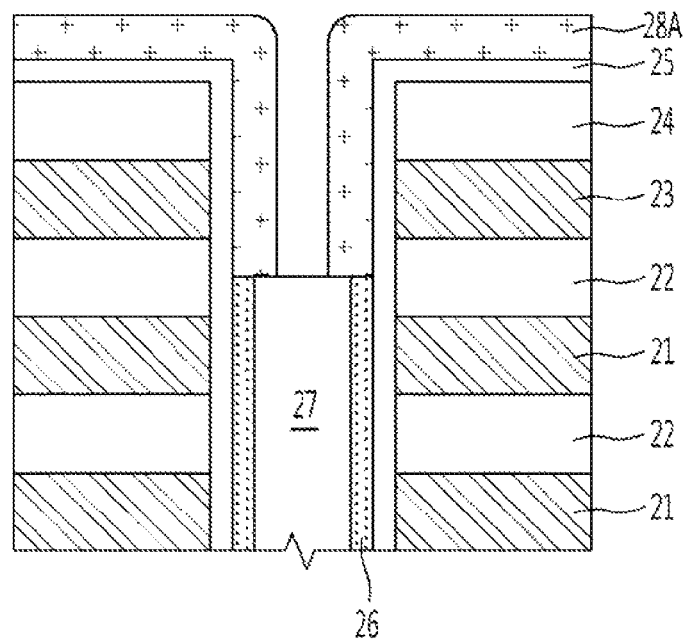

As illustrated in FIG. 2B, a third semiconductor layer 28A may be formed by reacting the second semiconductor layer and the first semiconductor layer 26 using a thermal treatment process. Subsequently, a portion of the third semiconductor layer 28A that is formed at a bottom surface of the first recessed region may be etched to expose the first insulating layer 27. As a result, the third semiconductor layer 28A may have a tubular structure. For example, after the second semiconductor layer 28, formed at the bottom surface of the first recessed region, is etched to expose the first insulating layer 27, the third semiconductor layer 28A may be formed by performing a thermal treatment process.

Figure 2C:
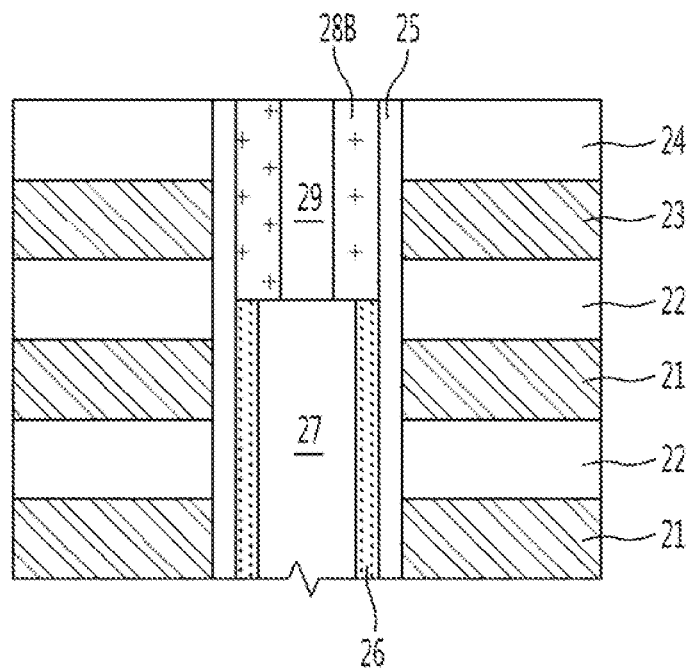

As illustrated in FIG. 2C, a second insulating layer 29 may be formed in the open central portion of the third semiconductor layer 28A. After the second insulating layer 29 is formed, a thermal treatment process may be performed to form the third semiconductor layer 28A.

The second insulating layer 29 and the third semiconductor layer 28A may be planarized until a surface of the fourth material layer 24 is exposed. As a result, a first semiconductor layer 26A and a second semiconductor layer 28B may be formed. The first semiconductor layer 26A may pass through the first and second material layers 21 and 22 and have a tubular structure. The second semiconductor layer 28B may be coupled to the first semiconductor layer 26A, pass through the third and fourth material layers 23 and 24 and have a tubular structure.

Figure 2D:
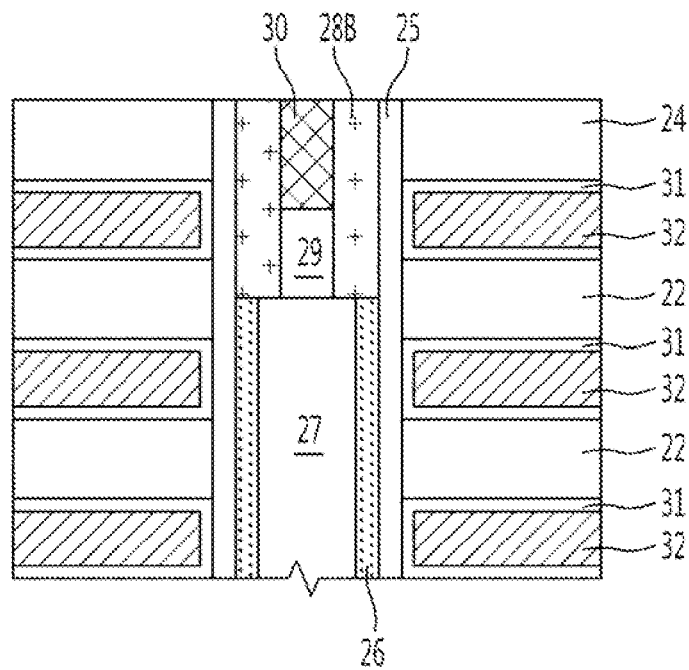

As illustrated in FIG. 2D, the second insulating layer 29 may be etched to form a second recessed region, and the second recessed region may be filled with a conductive layer to form a junction 30. For example, the junction 30 may include a doped polysilicon layer.

The first to fourth material layers 21 to 24 may be etched to form a slit (not illustrated), and the first and third material layers 21 and 23 exposed through the slit may be removed to form third recessed regions. Subsequently, conductive layers 32 may be formed in the third recessed regions. Second memory layers 31 may be formed in the third recessed regions before the conductive layers 32 are formed.

Figure 3:
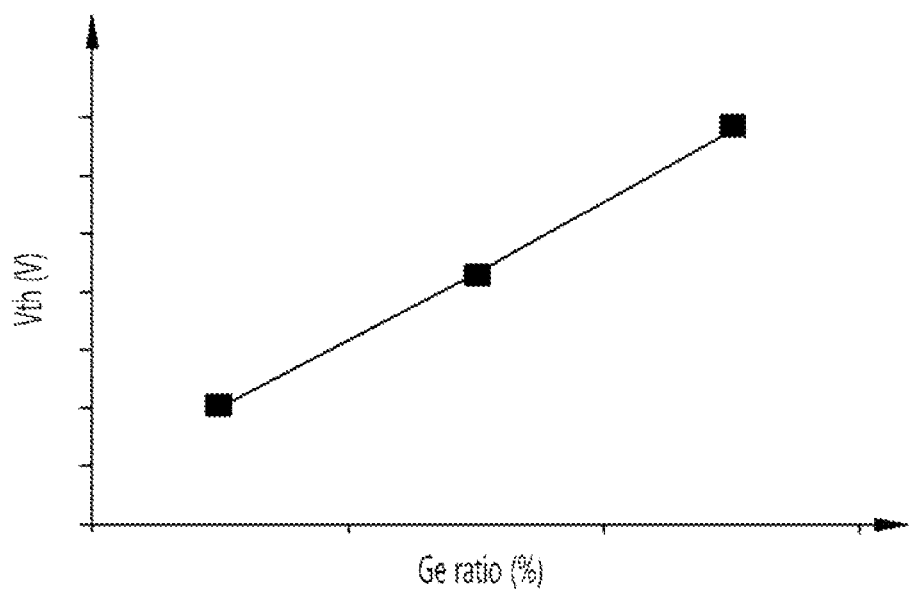
FIG. 3 is a graph illustrating characteristics of semiconductor device manufactured by an exemplary manufacturing method.

FIG. 3 is a graph illustrating characteristics of a semiconductor device manufactured by an exemplary manufacturing method. Here, the x-axis represents a ratio of germanium (Ge), and the y-axis represents a threshold voltage Vth of a transistor.

The graph in FIG. 3 shows the variation in threshold voltages Vth of selection transistors ST according to the ratio of germanium (Ge) included in a channel layer. According to the graph in FIG. 3, as the ratio of the germanium Ge included in the channel layer increases, the threshold voltages St of the selection transistors ST increase.

According to an above-described exemplary embodiment, memory cells MC and the selection transistors ST may be formed. The memory cells MC may include a first channel layer including polysilicon. The selection transistors ST may include a second channel layer coupled to the first channel layer and including silicon germanium. Therefore, the selection transistors ST may have higher threshold voltages than the memory cells MC. Accordingly, leakage current may be prevented, so that operating characteristics of the selection transistors ST may be improved.

Figure 4:
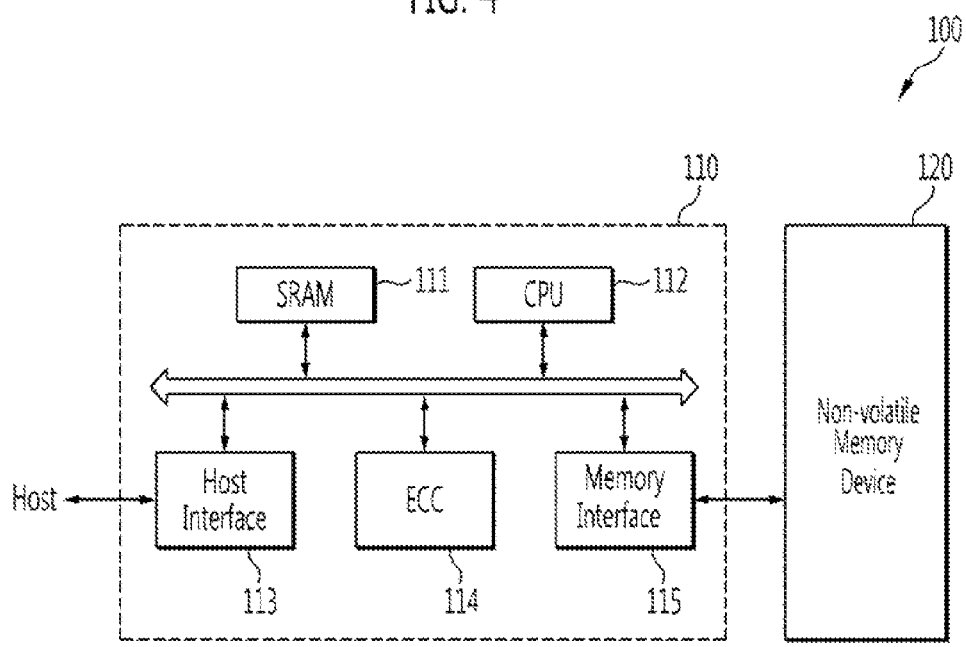
FIG. 4 is a block diagram illustrating the configuration of an exemplary memory system.

FIG. 4 is a block diagram illustrating a memory system according to an exemplary embodiment of the present invention.

As illustrated in FIG. 4, an exemplary memory system 100 may include a non-volatile memory device 120 and a memory controller 110.

The non-volatile memory device 120 may have the above-described structure. In addition, the non-volatile memory device 120 may be a multi-chip package composed of a plurality of flash memory chips.

The memory controller 110 may be configured control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI, or IDE.

Figure 5:
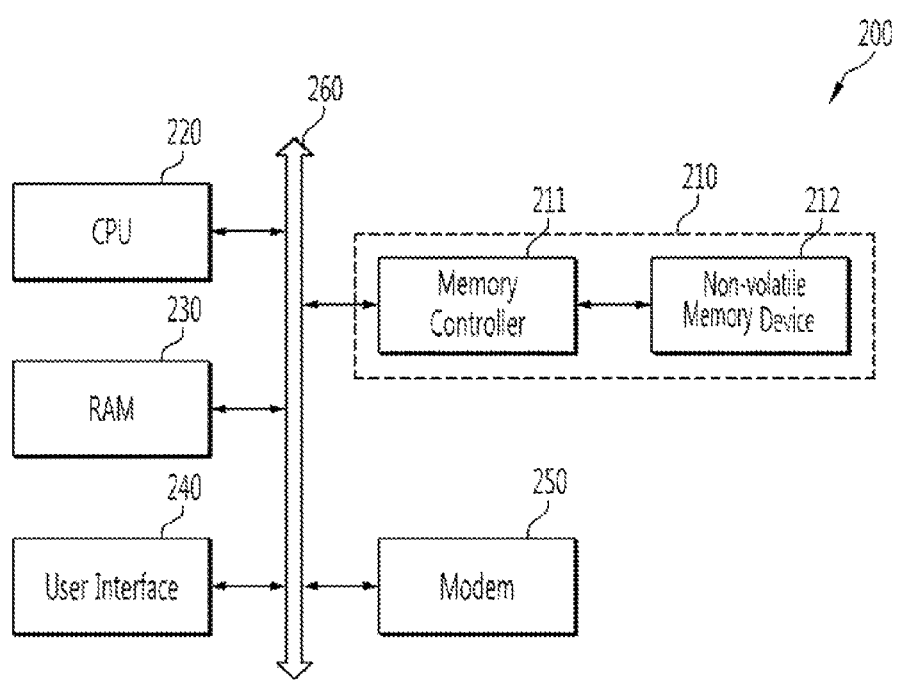
FIG. 5 is a block diagram illustrating the configuration of an exemplary computing system.

FIG. 5 is a block diagram illustrating the configuration of an exemplary computing system.

As illustrated in FIG. 5, an exemplary computing system 200 may include a CPU 220, RAM 230, a user interface 240, a modem 250 and a memory system 210 that are electrically coupled to a system bus 250. In addition, when the computing system 200 is a mobile device, a battery may be further included to apply operating voltage to the computing system 200. The computing system 200 may further include application chipsets, a CMOS Image Sensor (CIS) and mobile DRAM.

As described above with reference to FIG. 3, the memory system 210 may include a non-volatile memory device 212 and a memory controller 211.

According to an exemplary embodiment, since memory cells and selection transistors include a channel layer formed of different materials, threshold voltages of the selection transistors may be easily controlled.

What is claimed is:
1. A method of manufacturing a semiconductor device, the method comprising:
   alternately forming first material layers and second material layers;
   alternately forming at least one third material layer and at least one fourth material layer over the first material layers and the second material layers;

forming a hole through the first material layer to the fourth material layer to define a hole;

forming a first semiconductor layer in the hole;

forming a first insulating layer in an opening defined in the first semiconductor layer;

forming a recessed region by etching the first insulating layer;

forming a second semiconductor layer in the recessed region; and forming a third semiconductor layer by reacting the first semiconductor layer and the second semiconductor layer using a thermal treatment process.

2. The method of claim 1, further comprising:

forming a second insulating layer in an opening defined in the second semiconductor layer.

3. The method of claim 1, wherein the first semiconductor layer includes undoped polysilicon.

4. The method of claim 1, wherein the second semiconductor layer includes silicon germanium.

5. The method of claim 1, wherein forming the recessed region further comprises:

etching the first insulating layer so that a top surface of the first insulating layer is lower than or adjacent to a bottom surface of the third material layer.

6. The method of claim 1, further comprising:

defining a junction by doping a top portion of the second channel layer with an impurity.

7. The method of claim 1, wherein the first material layers are configured as control gates of memory cells, the third material layer is configured as a selection gate of a selection transistor, and the second and fourth material layers are configured as interlayer insulating layers.

* * * * *